United States Patent
Jang et al.

(10) Patent No.: US 11,409,391 B2
(45) Date of Patent: Aug. 9, 2022

(54) TOUCH DISPLAY DEVICE HAVING ROUTING LINES AND DISPLAY SIGNAL LINES

(71) Applicant: LG Display Co., Ltd., Seoul (KR)

(72) Inventors: Jae-Hyung Jang, Paju-si (KR); Min-Joo Kim, Seoul (KR); Jae-Won Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/112,972

(22) Filed: Dec. 4, 2020

(65) Prior Publication Data

US 2021/0200407 A1   Jul. 1, 2021

(30) Foreign Application Priority Data

Dec. 30, 2019   (KR) .................. 10-2019-0178371

(51) Int. Cl.
*G06F 3/041* (2006.01)
*G06F 3/045* (2006.01)
*H01L 27/32* (2006.01)

(52) U.S. Cl.
CPC .......... *G06F 3/04164* (2019.05); *G06F 3/045* (2013.01); *H01L 27/323* (2013.01); *H01L 27/3258* (2013.01); *G06F 2203/04111* (2013.01)

(58) Field of Classification Search
CPC ............................. G06F 3/04164; G06F 3/045
See application file for complete search history.

(56) References Cited

U.S. PATENT DOCUMENTS

| | | | |
|---|---|---|---|
| 2013/0176239 A1* | 7/2013 | Lo | G06F 3/0446 345/173 |
| 2017/0364194 A1* | 12/2017 | Jang | G06F 3/0443 |
| 2018/0033831 A1* | 2/2018 | An | G06F 3/04164 |
| 2018/0182818 A1 | 6/2018 | Kim | |
| 2019/0294273 A1* | 9/2019 | Yoshida | G06F 3/0418 |
| 2019/0339816 A1 | 11/2019 | Hsu et al. | |
| 2020/0110497 A1* | 4/2020 | Jin | G06F 3/0416 |
| 2021/0149524 A1* | 5/2021 | Bang | G06F 3/0445 |

FOREIGN PATENT DOCUMENTS

| | | |
|---|---|---|
| CN | 205563508 U | 9/2016 |
| EP | 3 316 103 A | 5/2018 |
| EP | 3 413 180 A | 12/2018 |
| EP | 3 598 278 A | 1/2020 |
| KR | 10-2018-0131010 A | 12/2018 |
| TW | 200719021 A | 5/2007 |

OTHER PUBLICATIONS

Extended European Search Report dated May 31, 2021 issued in European Patent Application No. 20211884.0 (11 pages).

* cited by examiner

*Primary Examiner* — Chun-Nan Lin
(74) *Attorney, Agent, or Firm* — Polsinelli PC (57) ABSTRACT

A touch display device in which routing lines are formed to have the same resistance value. Routing lines connected to touch electrodes in a non-active area and display signal links electrically connected to a light-emitting element are formed in different shapes from each other, and the lengths of at least one of zigzag patterns of the routing lines disposed in the non-active area and single-line regions are formed differently.

12 Claims, 12 Drawing Sheets

TOUCH DISPLAY DEVICE HAVING ROUTING LINES AND DISPLAY SIGNAL LINES

CROSS-REFERENCE TO RELATED APPLICATION

This application claims the benefit of Korean Patent Application No. 10-2019-0178371 filed on Dec. 30, 2019, which is hereby incorporated by reference in its entirety.

BACKGROUND

Field of the Disclosure

The present disclosure relates to a touch display device, and more particularly to a touch display device in which routing lines are formed to have the same resistance value.

Description of the Background

A touch sensor is an input device through which a user may input a command by selecting instructions displayed on a screen of a display device using a hand or an object. The touch sensor converts a contact position that directly contacts a human hand or an object into an electrical signal and receives selected instructions based on the contact position as an input signal. Such a touch sensor may substitute for a separate input device that is connected to a display device and operated, such as a keyboard or a mouse, and thus the range of application of the touch sensor is continually increasing.

Recently, research has been actively conducted on a touch display device in which a touch sensor is disposed on a display panel such as a liquid crystal display panel or an organic light-emitting diode display panel.

Routing lines connected to touch electrodes of a touch sensor have different lengths from each other depending on the positions of the touch electrodes. Therefore, the routing lines have different line resistance values. The difference in the line resistance values between the routing lines causes variation in RC delay values of touch signals determined by resistors (R) and capacitors (C) of the routing lines, which deteriorates touch performance.

SUMMARY

Accordingly, the present disclosure is directed to a touch display device that substantially obviates one or more problems due to limitations and disadvantages of the related art.

An object of the present disclosure is to provide a touch display device in which routing lines are formed to have the same resistance value.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a touch display device according to the present disclosure is configured such that routing lines connected to touch electrodes in a non-active area and display signal links electrically connected to a light-emitting element are formed in different shapes from each other and such that the lengths of at least one of zigzag patterns of the routing lines disposed in the non-active area and single-line regions are formed differently.

In accordance with the present disclosure, a touch display device is provided, comprising a substrate comprising an active area and a non-active area; a light-emitting element disposed on the substrate; a plurality of touch electrodes disposed on the light-emitting element; a plurality of routing lines connected to the touch electrodes; and a plurality of display signal links intersecting the routing lines in the non-active area and electrically connected to the light-emitting element, wherein the routing lines and the display signal links have different shapes from each other in the non-active area.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspect(s) of the disclosure and together with the description serve to explain the principle of the disclosure.

In the drawings.

DETAILED DESCRIPTION

Reference will now be made in detail to exemplary aspects of the present disclosure, examples of which are illustrated in the accompanying drawings.

The terminology "on" disclosed in this specification means that an element is formed directly on another element and moreover a third element is interposed between these elements.

The terminologies such as "first" and "second" disclosed in this specification do not mean the order of corresponding elements and are intended to identify the corresponding elements from each other.

The terminology "at least one of A, B and C" disclosed in this specification may be construed as A only, B only, C only, or any combination of two or more of A, B, and C, such as, for instance, ABC, ABB, BC, and CC.

Hereinafter, aspects of the present disclosure will be described with reference to the accompanying drawings.

Figure 1:
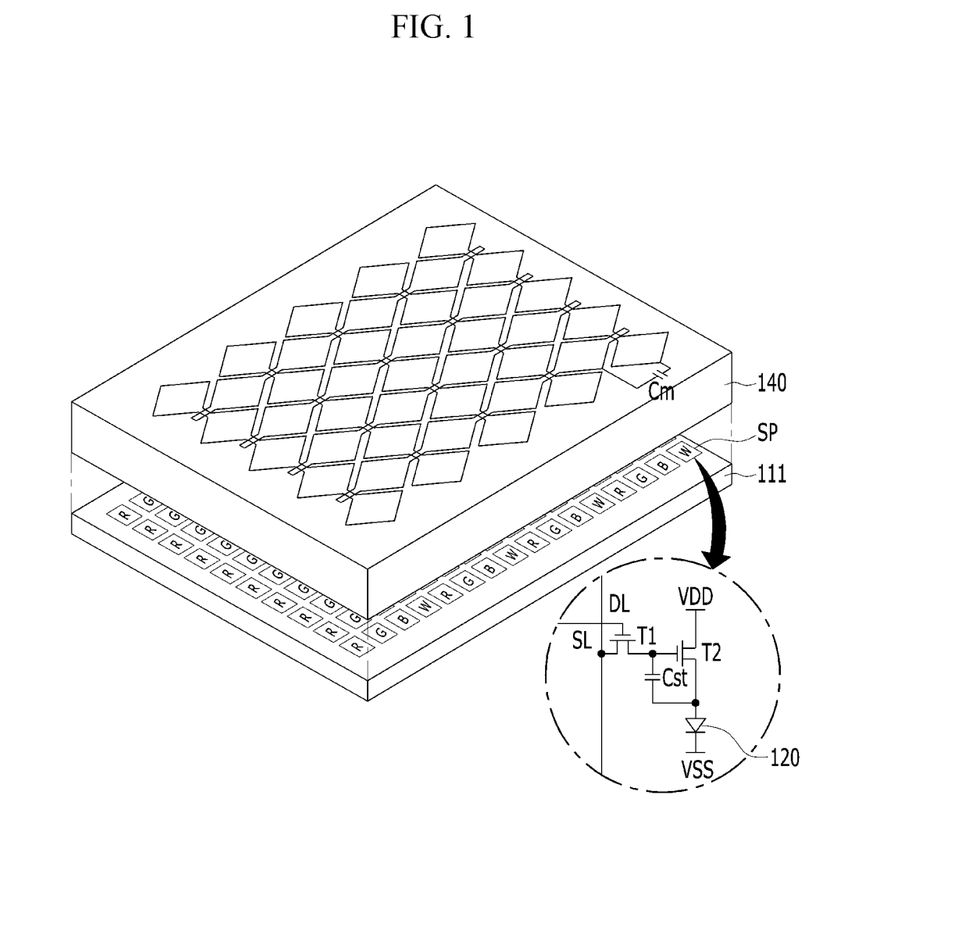
FIG. 1 is a perspective view of a touch display device according to the present disclosure.

FIG. 1 is a perspective view of a touch display device according to the present disclosure.

Figure 2:
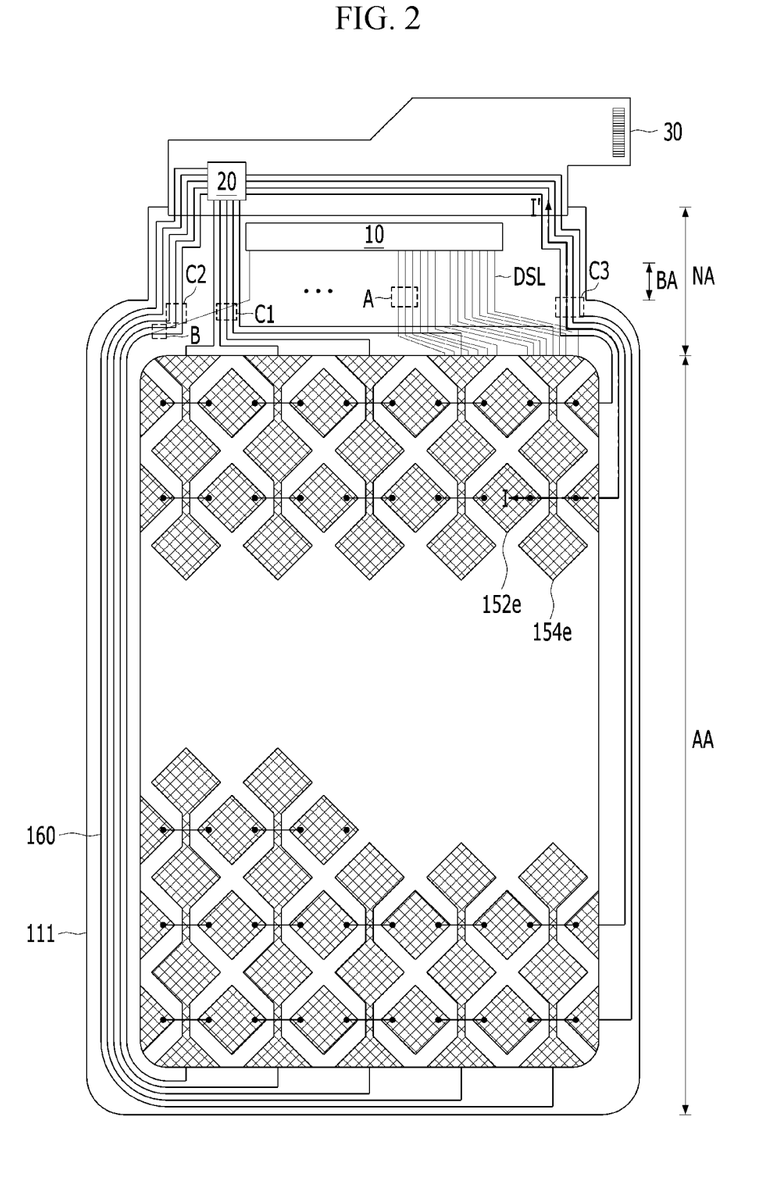
FIG. 2 is a plan view of the touch display device shown in FIG. 1.

The touch display device shown in FIG. 1 senses the presence or absence of a touch and a touch position by sensing a variation in mutual capacitance Cm (a touch sensor) in response to a user touch through touch electrodes 152e and 154e shown in FIG. 2 for a touch period. The touch display device shown in FIG. 1 displays an image through a unit pixel including a light-emitting element 120.

To this end, the touch display device includes a unit pixel composed of a plurality of subpixels SP arranged in a matrix form on a substrate 111, an encapsulation unit 140 disposed on the plurality of subpixels SP, and a touch sensor Cm disposed on the encapsulation unit 140.

The unit pixel is composed of red (R), green (G) and blue (B) subpixels SP, which are arranged in a row, or is composed of red (R), green (G), blue (B) and white (W) subpixels SP, as shown in FIG. 1.

Each of the subpixels SP includes a pixel-driving circuit and a light-emitting element 120 connected to the pixel-driving circuit.

The pixel-driving circuit includes a switching transistor T1, a driving transistor T2, and a storage capacitor Cst. In the present disclosure, a structure in which the pixel-driving circuit includes two transistors T and one capacitor C has been described by way of example, but the present disclosure is not limited thereto. That is, a pixel-driving circuit having a 3T1C structure or 3T2C structure in which three or more transistors T and one or more capacitors C are provided may be used.

The switching transistor T1 is turned on when a scan pulse is supplied to a scan line SL, and supplies a data signal supplied to a data line DL to the storage capacitor Cst and a gate electrode of the driving transistor T2.

The driving transistor T2 controls the current I supplied from a high-voltage VDD supply line to the light-emitting element 120 in response to the data signal supplied to the gate electrode of the driving transistor T2, thereby adjusting the amount of light emitted from the light-emitting element 120. Even when the switching transistor T1 is turned off, the driving transistor T2 maintains the emission of light by the light-emitting element 120 by supplying a constant amount of current thereto using the voltage charged in the storage capacitor Cst until the data signal of the next frame is supplied.

Figure 3:
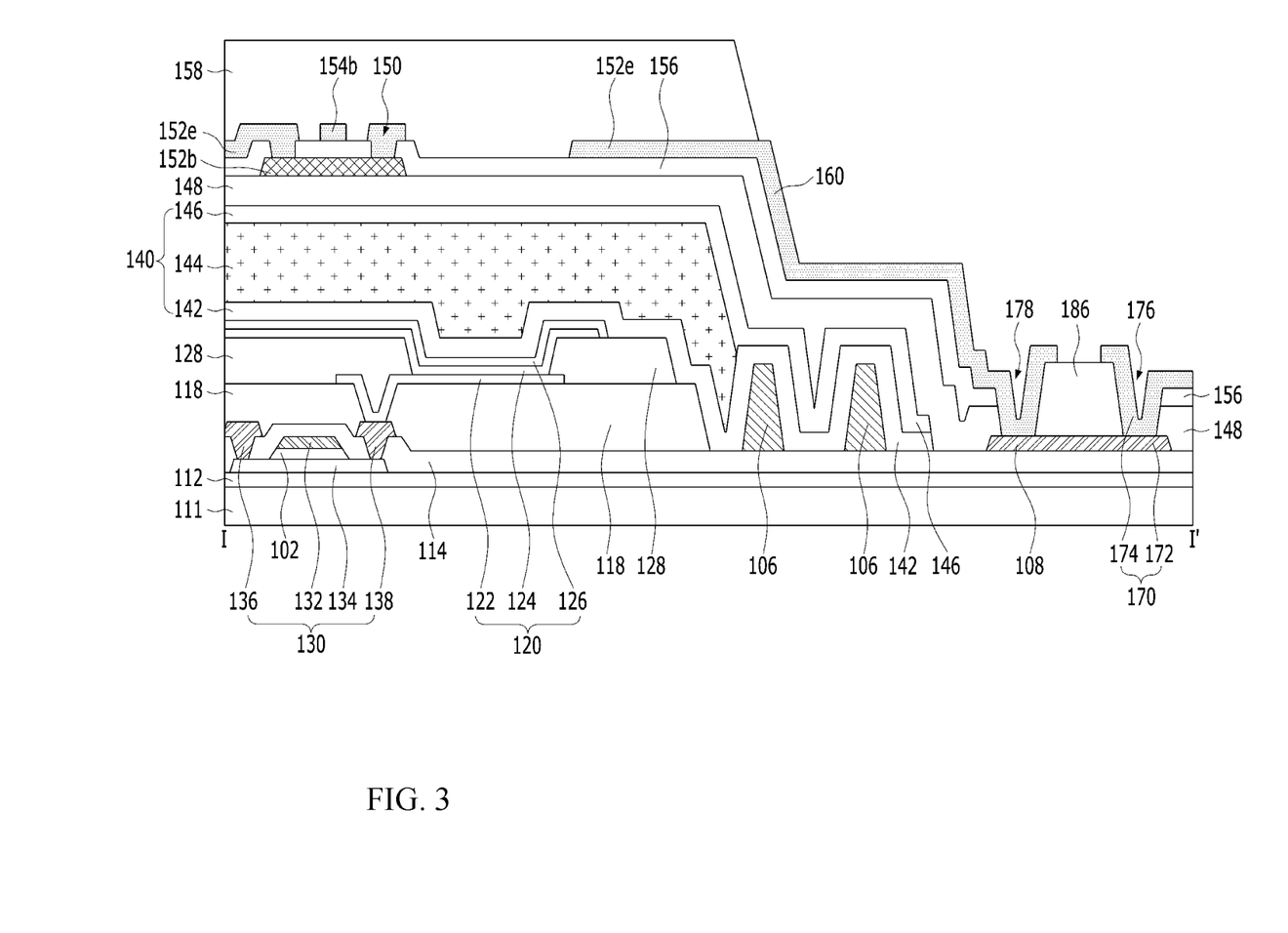
FIG. 3 is a cross-sectional view taken along line I-I' in the touch display device of FIG. 2.

The driving thin-film transistor T2 (130), as shown in FIGS. 2 and 3, includes a semiconductor layer 134 disposed on a buffer layer 112, a gate electrode 132 overlapping the semiconductor layer 134 with a gate insulating film 102 interposed therebetween, and source and drain electrodes 136 and 138 formed on an interlayer insulating film 114 so as to be in contact with the semiconductor layer 134. The semiconductor layer 134 is formed of at least one of an amorphous semiconductor material, a polycrystalline semiconductor material, and an oxide semiconductor material.

The light-emitting element 120 includes an anode 122, a light-emitting stack 124 formed on the anode 122, and a cathode 126 formed on the light-emitting stack 124.

The anode 122 is electrically connected to the drain electrode 138 of the driving thin-film transistor T2 (130), which is exposed through a pixel contact hole that penetrates a pixel planarization layer 118.

At least one light-emitting stack 124 is formed on the anode 122 in an emission area that is defined by a bank 128. The at least one light-emitting stack 124 is formed by stacking a hole-related layer, an organic emission layer, and an electron-related layer on the anode 122 in that order or in the reverse order. In addition, the light-emitting stack 124 may include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated through the first and second light-emitting stacks. Since the white light generated in the light-emitting stack 124 is incident on a color filter located above the light-emitting stack 124, a color image may be realized. Alternatively, colored light corresponding to each subpixel may be generated in each light-emitting stack 124 without a separate color filter in order to realize a color image. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode 126 is formed so as to face the anode 122, with the light-emitting stack 124 interposed therebetween. The cathode 126 is connected to a low-voltage VSS supply line.

The encapsulation unit 140 prevents external moisture or oxygen from entering the light-emitting element 120, which is vulnerable to external moisture or oxygen. To this end, the encapsulation unit 140 includes a plurality of inorganic encapsulation layers 142 and 146 and an organic encapsulation layer 144 disposed between the plurality of inorganic encapsulation layers 142 and 146. The inorganic encapsulation layer 146 is disposed at the top of the encapsulation unit 140. In this case, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between the first and second inorganic encapsulation layers 142 and 146 will be described by way of example.

The first inorganic encapsulation layer 142 is formed on the substrate 111, on which the cathode 126 has been formed, at the position that is the closest to the light-emitting element 120. The first inorganic encapsulation layer 142 is formed of an inorganic insulating material that is capable of being deposited at a low temperature, such as silicon nitride (SiNx), silicon oxide (SiOx), silicon oxynitride (SiON), or aluminum oxide ($Al_2O_3$). Thus, since the first inorganic encapsulation layer 142 is deposited in a low-temperature atmosphere, it is possible to prevent damage to the light-emitting stack 124, which is vulnerable to a high-temperature atmosphere, during the process of depositing the first inorganic encapsulation layer 142.

The organic encapsulation layer 144 serves to dampen the stress between the respective layers due to bending of the organic light-emitting display device and to increase planarization performance. The organic encapsulation layer 144 is formed of an organic insulating material, such as acrylic resin, epoxy resin, polyimide, polyethylene, or silicon oxycarbide (SiOC).

When the organic encapsulation layer 144 is formed through an inkjet method, at least one dam 106 is disposed in order to prevent the organic encapsulation layer 144, which is in a liquid state, from spreading to an edge of the substrate 111. The at least one dam 106 may prevent the organic encapsulation layer 144 from spreading to a pad area, in which a touch pad 170 disposed at the outermost portion of the substrate 111 is disposed. To this end, the at least one dam 106 may be formed so as to completely surround an active area, in which the light-emitting element 120 is disposed, or may be formed only between the active area and the pad area. When the pad area, in which the touch pad 170 and the display pad are disposed, is disposed at one side of the substrate 111, the at least one dam 106 is disposed only on the one side of the substrate 111. When the pad area, in which the touch pad 170 and the display pad are disposed, is disposed at opposite sides of the substrate 111, the at least one dam 106 is disposed on the opposite sides of the substrate 111. The at least one dam 106 is formed in a single-layered or multi-layered structure. The at least one dam 106 is formed of the same material as at least one of the pixel planarization layer 118, the bank 128, and the spacer, and is formed simultaneously therewith.

The second inorganic encapsulation layer 146 is formed on the substrate 111, on which the organic encapsulation layer 144 has been formed, so as to cover the top and side surfaces of each of the organic encapsulation layer 144 and the first inorganic encapsulation layer 142. Accordingly, the second inorganic encapsulation layer 146 minimizes or prevents permeation of external moisture or oxygen into the first inorganic encapsulation layer 142 and the organic encapsulation layer 144. The second inorganic encapsulation layer 146 is formed of an inorganic insulating material, such as silicon nitride (SiNx), silicon oxide (SiOx), silicon oxynitride (SiON), or aluminum oxide ($Al_2O_3$).

A touch insulating film 156 and a touch sensor Cm, which includes a touch-sensing line 154 and a touch-driving line 152, which are disposed so as to intersect each other, with the touch insulating film 156 interposed therebetween, are disposed on the encapsulation unit 140. The touch sensor charges an electric charge using a touch-driving pulse supplied to the touch-driving line 152, and discharges the electric charge to the touch-sensing line 154.

The touch-driving line 152 includes a plurality of first touch electrodes 152e and first bridges 152b electrically connecting the first touch electrodes 152e to each other.

The first touch electrodes 152e are spaced apart from each other at regular intervals in an X direction, which is a first direction, on the touch insulating film 156. Each of the first touch electrodes 152e is electrically connected to a neighboring first touch electrode 152e via the first bridge 152b.

The first bridge 152b is exposed through a touch contact hole 150 that penetrates the touch insulating film 156, and is electrically connected to the first touch electrode 152e.

The touch-sensing line 154 includes a plurality of second touch electrodes 154e and second bridges 154b electrically connecting the second touch electrodes 154e to each other.

The second touch electrodes 154e are spaced apart from each other at regular intervals in a Y direction, which is a second direction, on the touch insulating film 156. Each of the second touch electrodes 154e is electrically connected to a neighboring second touch electrode 154e via the second bridge 154b.

The second bridge 154b is disposed on the touch insulating film 156 so as to be located in the same plane as the second touch electrode 154e. Thus, the second bridge 154b is electrically connected to the second touch electrode 154e without a separate contact hole.

A touch buffer film 148 may be disposed between each of the touch-driving line 152 and the touch-sensing line 154 and the encapsulation unit 140. Since the spacing distance between each of the touch-driving line 152 and the touch-sensing line 154 and the cathode 126 is increased by the touch buffer film 148, it is possible to reduce the capacity of a parasitic capacitor between each of the touch-driving line 152 and the touch-sensing line 154 and the cathode 126.

The first and second touch electrodes 152e and 154e and the first and second bridges 152b and 154b are formed in a mesh type such that they do not overlap the emission area of each subpixel SP but overlap the bank 128. Accordingly, it is possible to prevent an aperture ratio and transmissivity from being deteriorated by the first and second touch electrodes 152e and 154e and the first and second bridges 152b and 154b.

The first and second touch electrodes 152e and 154e and the first and second bridges 152b and 154b have higher conductivity than a transparent conductive film, and thus are formed as low-resistance electrodes. The first and second touch electrodes 152e and 154e and the first and second bridges 152b and 154b are formed in a single-layered or multi-layered structure together with routing lines 160 using a touch metal layer formed of a material having high corrosion resistance and acid resistance and excellent conductivity, such as Ta, Ti, Cu, or Mo. For example, the first and second touch electrodes 152e and 154e and the first and second bridges 152b and 154b and the routing lines 160 are formed in a triple-layered structure such as a stack of Ti/Al/Ti, MoTi/Cu/MoTi, or Ti/Al/Mo. Accordingly, the resistances and capacitances of the first and second touch electrode 152e and 154e, the first and second bridges 152b and 154b, and the routing lines 160 are reduced. As a result, RC delay is reduced, thus improving touch sensitivity.

A touch protective film 158 is formed so as to cover the touch sensor including the touch electrodes 152e and 154e and the bridges 152b and 154b. The touch protective film 158 is disposed in the active area AA, rather than in the non-active area NA in which the touch pad 170 is disposed. The touch protective film 158 prevents the touch sensor from being damaged by external moisture or impacts. The touch protective film 158 is formed of an organic insulating material or an inorganic insulating material such as SiNx or SiOx.

A bending area BA for bending or folding the substrate 111 is included in the non-active area NA, which is exposed by the touch protective film 158. A crack prevention layer 186 is disposed in the bending area BA so that the bending area BA is easily bent.

The crack prevention layer 186 is formed on an auxiliary touch line 108 and a first pad electrode 172 using an organic insulating material having a higher strain rate and higher impact resistance than the inorganic insulating film. For example, since the crack prevention layer 186 is formed together with at least one of the pixel planarization layer 118 and the bank 128, the crack prevention layer 186 is disposed in the same plane as at least one of the pixel planarization layer 118 and the bank 128 using the same material. The crack prevention layer 186, which is formed of an organic insulating material, has a higher strain rate than the inorganic insulating material and thus alleviates bending stress caused by bending of the substrate 111. Accordingly, the crack prevention layer 186 is capable of preventing cracking of the bending area BA, thus preventing cracks from spreading to the active area AA.

In addition, a display pad connected to a display signal link DSL and the touch pad 170 connected to the routing lines 160 are disposed in the non-active area NA. The display signal link DSL electrically connects at least one of the data line DL, the scan line SL, the low-voltage VSS supply line, and the high-voltage VDD supply line to the display pad.

The display pad and the touch pad 170 may be disposed in the non-active area NA disposed in at least one of one region and the opposite region of the substrate 111. Alternatively, the touch pad 170 and the display pad may be disposed in respectively different non-active areas NA. The structures of the touch pad 170 and the display pad are not limited to those shown in FIG. 2, and may be variously changed depending on the design requirements of the display device.

The touch pad 170 and the display pad are disposed on an insulating film disposed under the light-emitting element 120. For example, the touch pad 170 is disposed on the interlayer insulating film 114 together with the display pad. The touch pad 170 and the display pad are formed so as to be exposed by the touch protective film 158. Accordingly, the touch pad 170 is connected to a signal transmission film 30, on which a touch driving circuit 20 has been mounted, and the display pad is connected to a display driving circuit 10 such that at least one of a scan driving unit and a data driving unit is connected thereto.

The touch pad 170 is composed of first and second pad electrodes 172 and 174, which are electrically connected.

Figure 4:
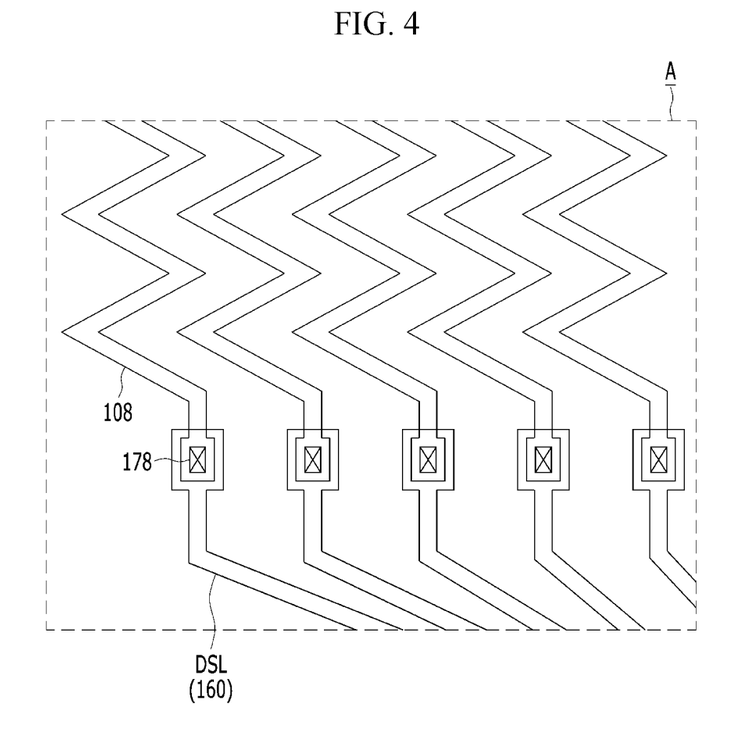
FIG. 4 is an enlarged plan view of portion A in FIG. 2.

The first pad electrode 172 may be formed of the same material as the source and drain electrodes 136 and 138, and may be disposed in the same plane as the source and drain electrodes 136 and 138. The auxiliary touch line 108, which extends from the first pad electrode 172, is exposed through a first pad contact hole 178, which penetrates the touch insulating film 156 and the touch buffer film 148 and is connected to the routing line 160. As shown in FIG. 4, the auxiliary touch line 108 may be disposed in a zigzag shape in the bending area BA, or may be disposed such that multiple hollow polygonal-shaped unit structures, multiple hollow circular-shaped unit structures, or combinations thereof are connected to each other in a row. Accordingly, it is possible to minimize damage to the auxiliary touch line 108 even when external force is applied thereto due to the curvature of the bending area BA.

The second pad electrode 174 is formed of the same material as at least one of the routing line 160, the touch electrodes 152e and 154e, and the bridges 152b and 154b, and is disposed on the touch insulating film 156. The second pad electrode 174 is connected to the first pad electrode 172, which is exposed through a second pad contact hole 176, which penetrates the touch insulating film 156 and the touch buffer film 148. The second pad contact hole 176 is formed together with the touch contact hole 150 and the first pad contact hole 178. That is, the second pad contact hole 176, the touch contact hole 150, and the first pad contact hole 178 are formed at the same time through the same mask process.

The routing line 160, which is connected to the touch pad 170 via the auxiliary touch line 108, extends from each of the touch electrodes 152e and 154e and is formed along a side surface of the encapsulation unit 140. The routing line 160 is disposed across the at least one dam 106. The routing line 160 is formed of the same material as at least one of the touch electrodes 152e and 154e and the bridges 152b and 154b, and is disposed on the touch insulating film 156.

The routing line 160 transmits a touch driving pulse generated by the touch driving circuit 20 to the touch driving line 152 through the touch pad 170, and transmits a touch signal from the touch sensing line 154 to the touch driving circuit 20 through the touch pad 170. Accordingly, the routing line 160 is formed between each of the first and second touch electrodes 152e and 154e and the touch pad 170, and electrically connects each of the first and second touch electrodes 152e and 154e to the touch pad 170. As shown in FIG. 2, the routing line 160 extends from the first touch electrode 152e to at least one of the left side and the right side of the active area AA, and is connected to the touch pad 170. In addition, the routing line 160 extends from the second touch electrode 154e to at least one of the upper side and the lower side of the active area, and is connected to the touch pad 170. This arrangement of the routing line 160 may be variously changed depending on the design requirements of the display device.

The routing line 160 is formed in a different shape from the display signal link DSL, which is connected to the display driving circuit, depending on the position at which the routing line 160 is formed.

Figure 5:
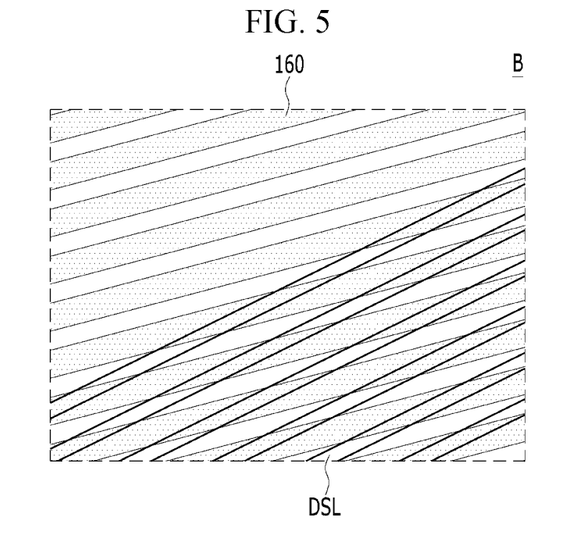
FIG. 5 is an enlarged plan view of portion B in FIG. 2.

As shown in FIG. 4, the routing line 160 and the display signal link DSL are formed in a straight line shape in region A adjacent to the bending area BA. As shown in FIG. 5, the routing line 160 and the display signal link DSL are also formed in a straight line shape in a corner area B. In this case, the routing line 160 and the display signal link DSL extend in different directions from each other, and thus are disposed so as to intersect each other.

Figure 6:
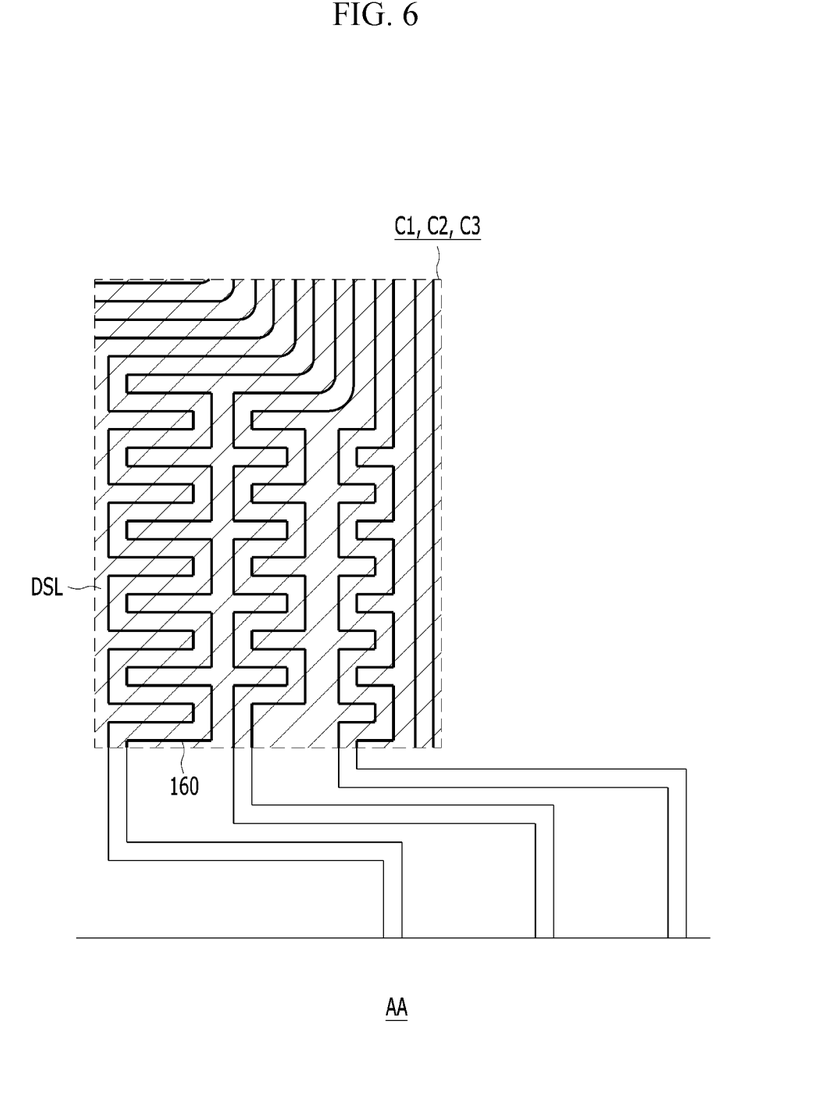
FIG. 6 is an enlarged plan view of portions C1, C2 and C3 in FIG. 2.

Resistance adjustment areas C1, C2 and C3 are disposed in at least a portion of the non-active area, except for the bending area BA and the corner area B. As shown in FIG. 6, in the resistance adjustment areas C1, C2 and C3, the display signal link DSL is formed in a straight line shape, whereas the routing line 160 is formed in a zigzag shape. The straight-line-shaped display signal link DSL is disposed so as to intersect the routing line 160.

In particular, in the resistance adjustment areas C1, C2 and C3, which are disposed between the bending area BA and the corner area B, the routing lines 160 are formed to have different respective lengths depending on the positions of the touch electrodes 152e and 154e connected to the routing lines 160. The routing lines 160 that have relatively short lengths to the touch electrodes 152e and 154e are formed to have relatively long lengths in the resistance adjustment areas C1, C2 and C3, and the routing lines 160 that have relatively long lengths to the touch electrodes 152e and 154e are formed to have relatively short lengths in the resistance adjustment areas C1, C2 and C3. To this end, as shown in FIGS. 7A and 7B, the routing lines 160 disposed in the resistance adjustment areas C1, C2 and C3 are formed in a zigzag pattern so that the overall lengths of the respective routing lines 160 are uniform.

Figure 7A:
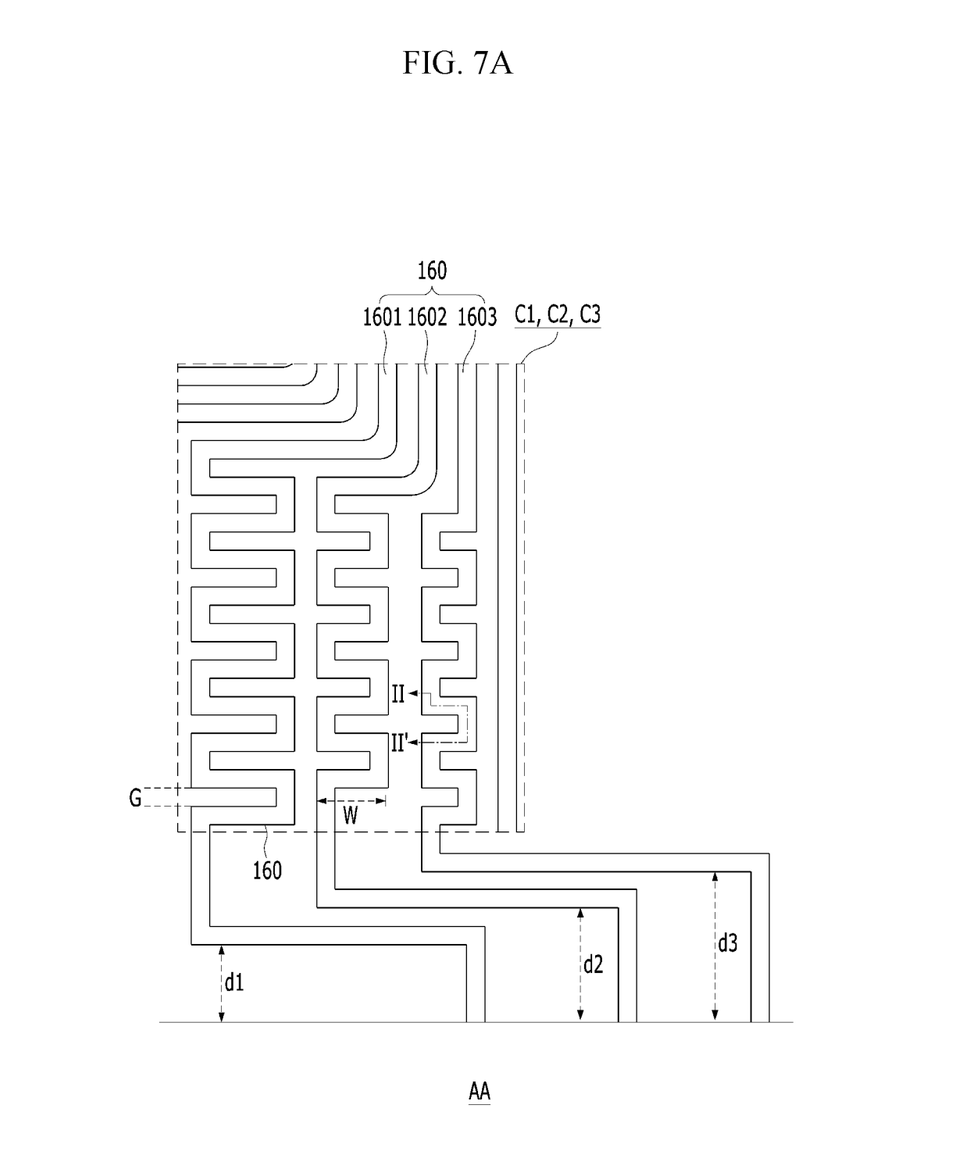
FIGS. 7A and 7B are plan views showing aspects of the routing lines shown in FIG. 6.

As shown in FIG. 7A, the farther away from the active area AA in which the touch electrodes 152e and 154e are disposed, the shorter the widths W of the zigzag patterns of the routing lines 160. The closer to the active area AA, the longer the widths W of the zigzag patterns of the routing lines 160. For example, the second routing line 1602 is spaced apart from the active area AA by a second distance d2, which is longer than the first distance d1 of the first routing line 1601 and is shorter than the third distance d3 of the third routing line 1603. In this case, the width W of the zigzag pattern of the second routing line 1602 is set to be longer than the width W of the zigzag pattern of the third routing line 1603, and is set to be shorter than the width W of the zigzag pattern of the first routing line 1601. Accordingly, the overall lengths of the respective routing lines 160 of the present disclosure are uniform, and thus it is possible to form the routing lines 160 so that they have the same resistance value. Because the routing lines 160 are formed to have the same resistance value, it is possible to prevent the occurrence of variation in RC delay values of touch signals, thereby preventing deterioration in touch performance.

Figure 7B:
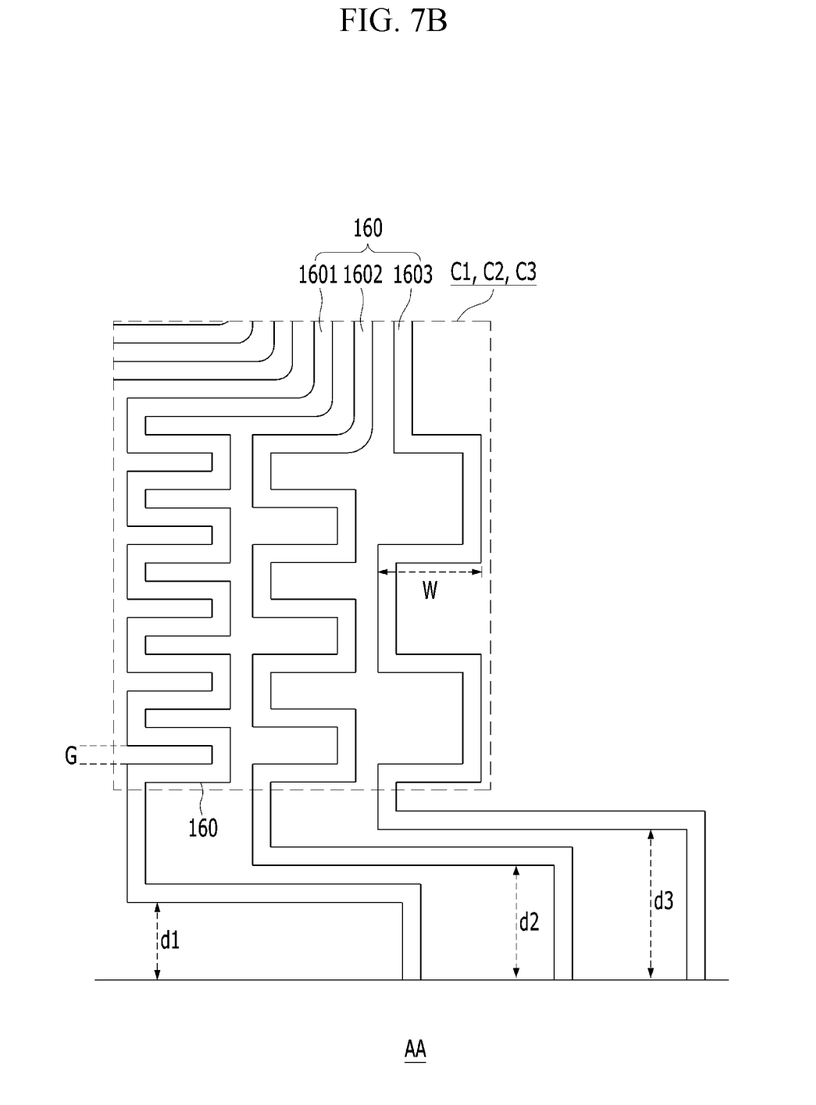

Alternatively, as shown in FIG. 7B, the farther away from the active area AA in which the touch electrodes 152*e* and 154*e* are disposed, the longer the pitches G of the zigzag patterns of the routing lines 160. The closer to the active area AA, the shorter the pitches G of the zigzag patterns of the routing lines 160. For example, the second routing line 1602 is spaced apart from the active area AA by a second distance d2, which is longer than the first distance d1 of the first routing line 1601 and is shorter than the third distance d3 of the third routing line 1603. In this case, the pitch G of the zigzag pattern of the second routing line 1602 is set to be shorter than the pitch G of the zigzag pattern of the third routing line 1603, and is set to be longer than the pitch G of the zigzag pattern of the first routing line 1601. Accordingly, the overall lengths of the respective routing lines 160 of the present disclosure are uniform, and thus it is possible to form the routing lines 160 so that they have the same resistance value. Because the routing lines 160 are formed to have the same resistance value, it is possible to prevent the occurrence of variation in RC delay values of touch signals, thereby preventing deterioration in touch performance.

Since the routing lines 160 are formed together with at least one of the first and second touch electrodes 152*e* and 154*e* and the first and second bridges 152*b* and 154*b*, they are formed in a single-layered or multi-layered structure.

Figure 8A:
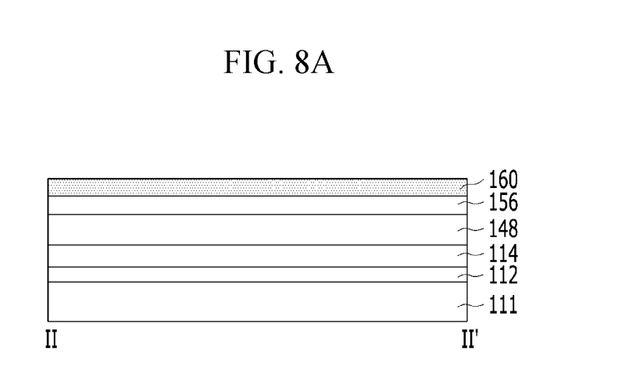
FIGS. 8A and 8B are cross-sectional views taken along line II-IF in the touch display device of FIG. 7A.

As shown in FIG. 8A, the routing lines 160 having a single-layered structure are formed together with the first bridge 152*b* or the second bridge 154*b*, and are thus formed in the same plane as the first bridge 152*b* or the second bridge 154*b* using the same material.

Figure 8B:
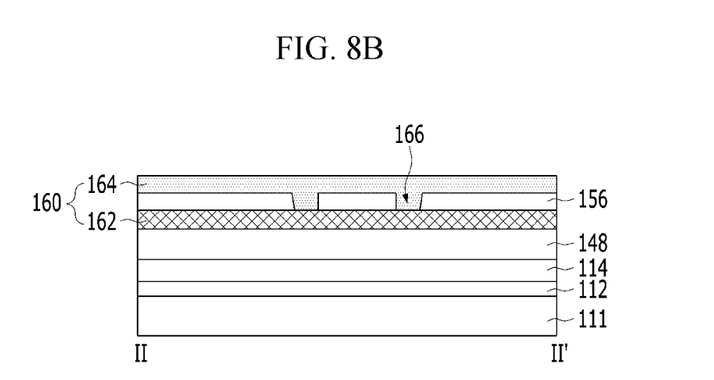

As shown in FIG. 8B, the routing lines 160 having a multi-layered structure include an upper conductive layer 164 and a lower conductive layer 162, which are disposed in a line shape on different respective layers. For example, the lower conductive layer 162 is disposed in the same plane as the first bridge 152*b* (on the touch buffer film 148) using the same material. The upper conductive layer 164 is disposed on the lower conductive layer 162 so as to overlap the lower conductive layer 162. For example, the upper conductive layer 164 is disposed in the same plane as the second bridge 154*b* (on the touch insulating film 156) using the same material. The upper conductive layer 164 and the lower conductive layer 162 are electrically connected through at least one contact hole 166, which penetrates the touch insulating film 156.

As described above, in the touch display device according to the present disclosure, the routing lines 160 are formed in zigzag patterns having respectively different lengths in the resistance adjustment areas. Accordingly, the overall lengths of the respective routing lines 160 are uniform, and thus it is possible to form the routing lines 160 so that they have the same resistance value. Because the routing lines 160 are formed to have the same resistance value, it is possible to prevent the occurrence of variation in RC delay values of touch signals, thereby preventing deterioration in touch performance.

Figure 9:
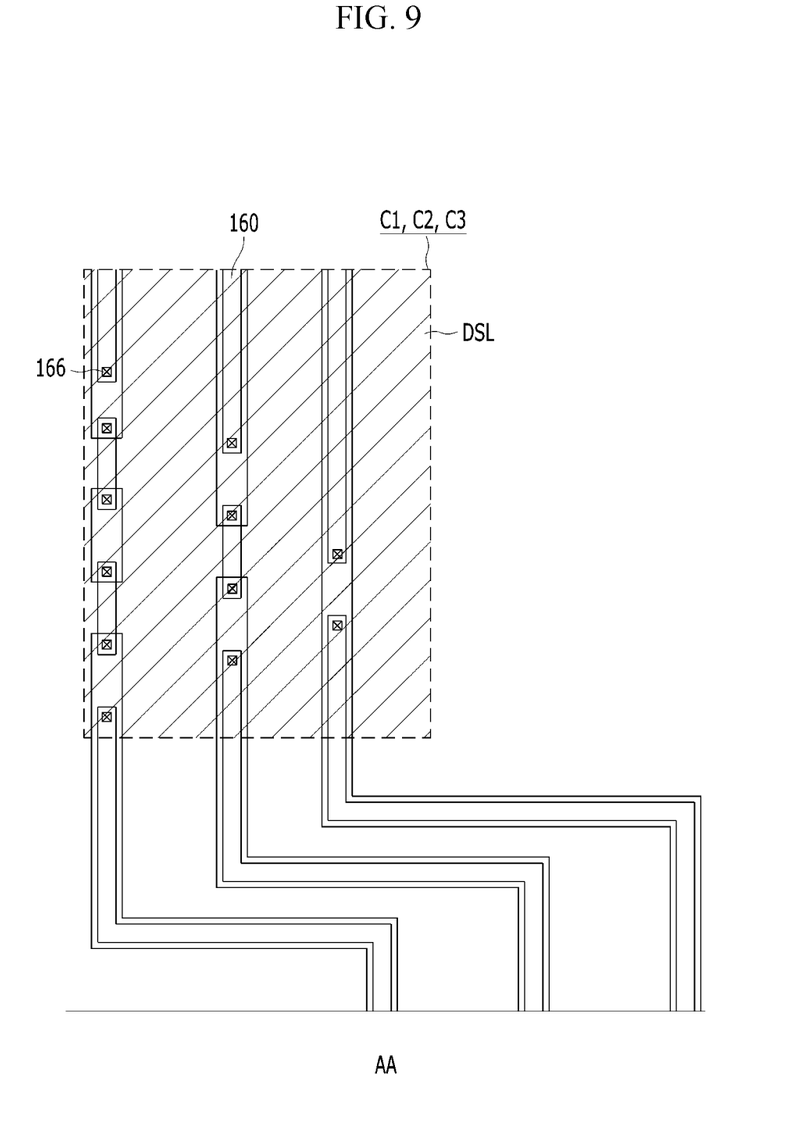
FIG. 9 is a plan view of a resistance adjustment area of a touch display device according to a second aspect of the present disclosure.
Figure 10:
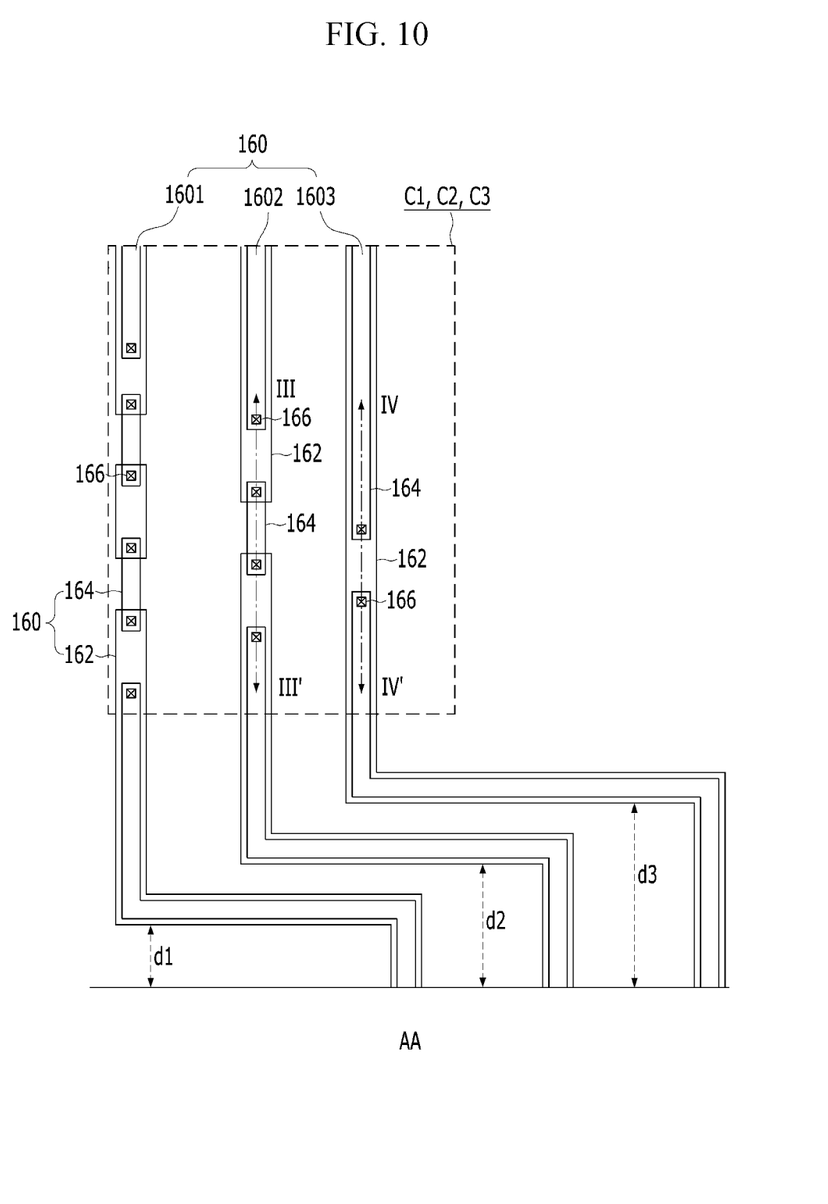
FIG. 10 is a plan view showing the routing lines of FIG. 9 in detail.

FIG. 9 is a view showing a touch display device according to a second aspect of the present disclosure. FIG. 10 is a plan view showing the routing lines of FIG. 9 in detail.

The touch display device shown in FIGS. 9 and 10 has the same configuration as the touch display device according to the first aspect of the present disclosure, except that the number of routing contact holes 166 formed in the resistance adjustment areas C1, C2 and C3 is varied. Therefore, a detailed description of the same components will be omitted.

In the resistance adjustment areas C1, C2 and C3, the display signal link DSL is formed in a straight line shape without a contact hole, and the routing line 160 has a routing contact hole 166 and is formed in a straight line shape. The straight-line-shaped display signal link DSL extends in a different direction from the routing line 160, and is thus disposed so as to intersect the routing line 160.

Figure 11:
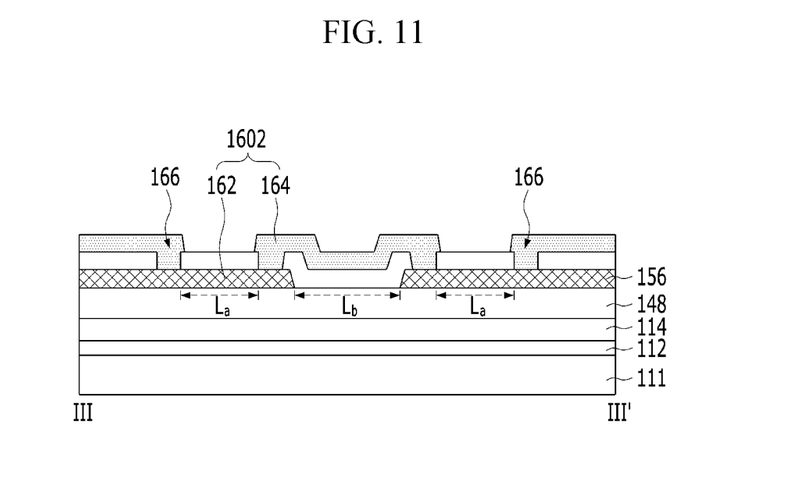
FIG. 11 is a cross-sectional view taken along line in the touch display device of FIG. 10.
Figure 12:
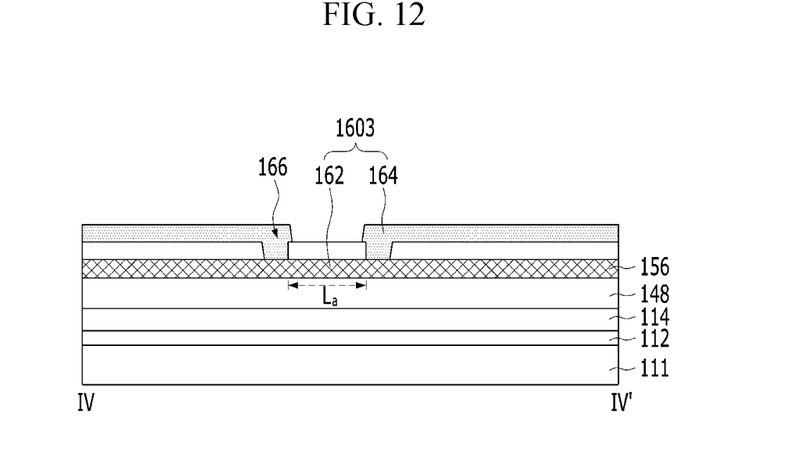
FIG. 12 is a cross-sectional view taken along line IV-IV' in the touch display device of FIG. 10.

In relation to the routing lines 160 disposed in the resistance adjustment areas C1, C2 and C3, as shown in FIGS. 11 and 12, the number of routing contact holes 166 connecting the upper conductive layer 164 to the lower conductive layer 162 and the lengths of single-line regions are formed differently. The number of routing contact holes 166 and the lengths of single-line regions are designed differently depending on the difference in the line resistance values between the routing lines 160. The positions of the routing contact holes 166 and the positions of the single-line regions may be variously designed.

In the resistance adjustment areas C1, C2 and C3, when the routing lines 160 have relatively short lengths to the touch electrodes 152*e* and 154*e*, as shown in FIG. 11, the single-line region, in which each of the upper conductive layer 164 and the lower conductive layer 162 is independently formed without overlapping between the upper conductive layer 164 and the lower conductive layer 162, is formed to be relatively long. That is, the overall length of at least one of the single length La of the lower conductive layer 162 and the single length Lb of the upper conductive layer 164 is set to be relatively long. In this case, the number of upper conductive layers 164 and the number of lower conductive layers 162, which are formed independently, increase. Thus, the number of routing contact holes 166, which connect the upper conductive layers 164 to the lower conductive layers 162, also increases. Since the routing lines 160 having an increased number of routing contact holes 166 have relatively long single-line regions, the line resistance values of the routing lines 160 in the resistance adjustment areas C1, C2 and C3 are relatively increased.

In the resistance adjustment areas C1, C2 and C3, when the routing lines 160 have relatively long lengths to the touch electrodes 152*e* and 154*e*, as shown in FIG. 12, the single-line region is formed to be relatively short. That is, the overall length of at least one of the single length La of the lower conductive layer 162 and the single length Lb of the upper conductive layer 164 is set to be relatively short. In this case, the number of upper conductive layers 164 and the number of lower conductive layers 162, which are formed independently, decrease. Thus, the number of routing contact holes 166, which connect the upper conductive layers 164 to the lower conductive layers 162, also decreases. Since the routing lines 160 having a decreased number of routing contact holes 166 have relatively short single-line regions, the line resistance values of the routing lines 160 in the resistance adjustment areas C1, C2 and C3 are relatively decreased.

For example, the number of routing contact holes 166 and the length of the single-line region of the first routing line 1601, which is spaced apart from the active area AA by the first direction d1, are set to be greater than the number of routing contact holes 166 and the length of the single-line region of the second routing line 1602, which is spaced apart from the active area AA by the second distance d2, which is longer than the first distance d1. The number of routing contact holes 166 and the length of the single-line region of the second routing line 1602 are set to be greater than the number of routing contact holes 166 and the length of the single-line region of the third routing line 1603, which is spaced apart from the active area AA by the third distance d3, which is longer than the second distance d2.

As described above, as the lengths of the routing lines 160 to the touch electrodes 152e and 154e decrease, the number of routing contact holes 166 and the lengths of single-line regions increase, and thus the contact resistance and the single-line resistance increase. As the lengths of the routing lines 160 to the touch electrodes 152e and 154e increase, the number of routing contact holes 166 and the lengths of single-line regions decrease, and thus the contact resistance and the single-line resistance decrease. That is, according to the present disclosure, the number of routing contact holes 166 and the lengths of the single-line regions are designed differently, so that the routing lines 160 have the same resistance value. Because the routing lines 160 are formed to have the same resistance value, it is possible to prevent the occurrence of variation in RC delay values of touch signals, thereby preventing deterioration in touch performance.

According to the present disclosure, the line widths of the routing lines 160 disposed in the resistance adjustment areas C1, C2 and C3 are set to be similar to the line widths of the routing lines 160 disposed in the remaining areas, other than the resistance adjustment areas C1, C2 and C3. Accordingly, the area occupied by the routing lines 160 in the resistance adjustment areas C1, C2 and C3 is reduced, thus increasing design freedom. In particular, other components such as inspection patterns, in addition to the routing lines 160, can be disposed in the resistance adjustment areas C1, C2 and C3, thus increasing the utilization of the resistance adjustment areas C1, C2 and C3.

Figure 13:
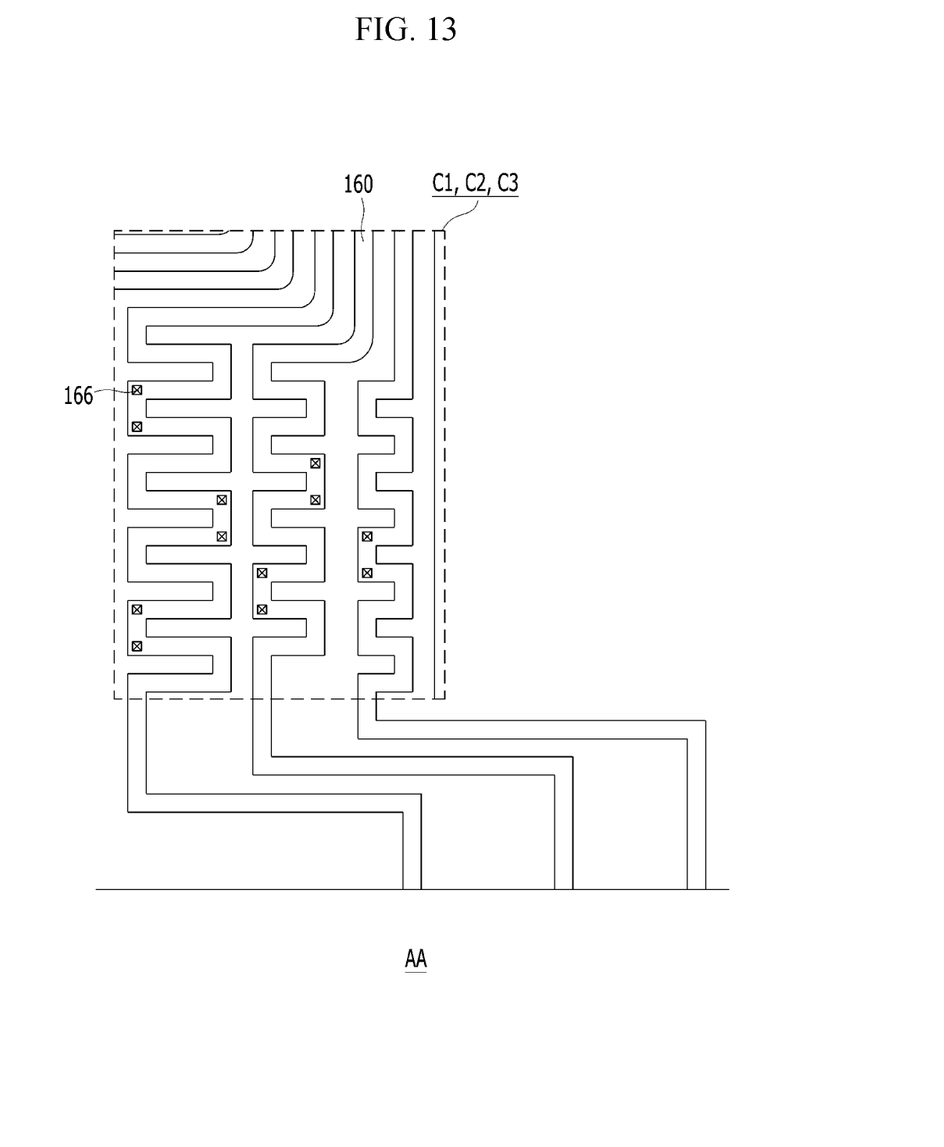
FIG. 13 is a plan view of a resistance adjustment area of a touch display device according to a third aspect of the present disclosure.

Further, according to the present disclosure, as shown in FIG. 13, it is possible to form the routing lines 160 so that they have the same resistance value by adjusting the lengths of the zigzag patterns of the routing lines 160 disposed in the resistance adjustment areas C1, C2 and C3 and the number of routing contact holes 166.

Although the present disclosure has been described by way of example as including an active area AA having a non-rectangular structure in which the corner portions thereof are formed in a diagonal or rounded shape, the present disclosure can also be applied to an active area AA having a rectangular structure.

Although the present disclosure has been described by way of example as having a mutual-capacitance-type touch sensor structure, the present disclosure is not limited thereto. The present disclosure can also be applied to a self-capacitance-type touch sensor structure. That is, each of the plurality of touch electrodes includes a capacitance formed therein, and thus is used as a self-capacitance-type touch sensor that senses variation in capacitance due to a user touch. Each of the touch electrodes is connected to a respective one of the routing lines in one-to-one correspondence. Each of the touch electrodes is electrically connected to a corresponding one of the routing lines, and is not connected to the remaining routing lines. For example, the mth touch electrode (where "m" is a natural number) is electrically connected to the mth routing line, and is not connected to the remaining routing lines other than the mth routing line. The m+1th touch electrode is electrically connected to the m+1th routing line, and is not connected to the remaining routing lines other than the m+1th routing line. In this case, the routing lines may be disposed across the touch electrodes, or may be disposed between the touch electrodes. The routing lines are disposed on a different layer from the touch electrodes, with the touch insulating film interposed therebetween, and thus are electrically connected to the touch electrodes through the contact holes, which penetrate the touch insulating film. Alternatively, the routing lines may be disposed in the same layer as the touch electrodes, and thus may be directly connected to the touch electrodes without separate contact holes.

As is apparent from the above description, in a touch display device according to the present disclosure, the lengths of at least one of zigzag patterns of routing lines and single-line regions are formed differently so that the routing lines have the same resistance value. Because the routing lines 160 are formed to have the same resistance value, it is possible to prevent the occurrence of variation in RC delay values of touch signals, thereby preventing deterioration in touch performance.

In addition, the area occupied by the routing lines in resistance adjustment areas, which are disposed in at least a portion of a non-active area, rather than in a corner area and a bending area, is reduced, thus increasing design freedom.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A touch display device comprising:
   a substrate comprising an active area and a non-active area having a corner area, a bending area and a resistance adjustment area between the bending area and the corner area;
   a light-emitting element disposed on the substrate;
   a touch sensor including a plurality of touch-driving lines disposed in a first direction and a plurality of touch-sensing lines disposed in a second direction above the light-emitting element;
   a plurality of routing lines comprising first, second and third routing lines connected to each of the plurality of touch-driving lines and the plurality of touch-sensing lines; and
   a plurality of display signal links intersecting the first, second and third routing lines in the non-active area and electrically connected to the light-emitting element,
   wherein the first, second and third routing lines and the display signal links have different shapes from each other in the non-active area,
   wherein the first, second and third routing lines disposed in a resistance adjustment area have different numbers of routing contact holes and the first routing line has a length shorter than the second routing line that has a length shorter than the third routing line,
   wherein the third routing to line has the number of routing contact holes less than the first and second routing lines in the resistance adjustment area,
   wherein the plurality of routing lines disposed in the resistance adjustment area comprise upper conductive layers and lower conductive layers connected to each other through the routing contact holes, and wherein the plurality of routing lines comprise single-line regions in which the upper conductive layers and the lower conductive layers do not overlap with each other between the routing contact holes.

2. The touch display device according to claim 1, wherein the plurality of routing lines and the plurality of display signal links have different shapes in the resistance adjustment area disposed in at least a portion of the non-active area except for a corner area.

3. The touch display device according to claim 2, wherein, in the resistance adjustment area, the plurality of routing lines are formed in a shape of straight lines having the routing contact holes, and the plurality of display signal links are formed in a shape of straight lines having no contact hole.

4. The touch display device according to claim 2, wherein the non-active area further comprises a bending area, and
wherein the resistance adjustment area is disposed between the bending area and the corner area.

5. The touch display device according to claim 1, wherein the plurality of display signal links and the plurality of routing lines have straight line shapes in a corner area of the non-active area, and
wherein the plurality of display signal links have straight line shapes and the plurality of routing lines have zigzag patterns in the resistance adjustment area adjacent to the corner area.

6. The touch display device according to claim 5, wherein the zigzag patterns of the plurality of routing lines have different lengths in the resistance adjustment area.

7. The touch display device according to claim 6, wherein the first routing line has zigzag patterns shorter than the second routing line in the resistance adjustment area, and
wherein the second routing line has zigzag patterns longer than the first routing line in the resistance adjustment area.

8. The touch display device according to claim 1, wherein, in the resistance adjustment area, the first routing line comprises single-line regions shorter than the second routing line, and the second routing line comprises single-line regions longer than the first routing line.

9. The touch display device according to claim 1,
wherein each of the plurality of touch-driving lines and the plurality of touch-sensing lines have touch electrodes and bridges connecting the touch electrodes and disposed in a different plane from the touch electrodes,
wherein the lower conductive layers are disposed in a same plane as one of the touch electrodes and the bridges, and
wherein the upper conductive layers are disposed in a same plane as a remaining one of the touch electrodes and the bridges.

10. A touch display device comprising:
a substrate comprising an active area and a non-active area;
a light-emitting element disposed on the substrate;
a touch sensor including a plurality of touch-driving lines disposed in a first direction and a plurality of touch-sensing lines disposed in a second direction above the light-emitting element;
a plurality of routing lines comprising first, second and third routing lines connected to each of the plurality of touch-driving lines and the plurality of touch-sensing lines; and
a plurality of display signal links intersecting the plurality of routing lines in the non-active area and electrically connected to the light-emitting element,
wherein the display signal links and the plurality of routing lines have a straight line shape in a corner area of the non-active area, and the display signal links have a straight line shape and the plurality of routing lines have zigzag patterns in a resistance adjustment area adjacent to the corner area,
wherein the plurality of routing lines disposed in the resistance adjustment area have different numbers of routing contact holes and the first routing line has a length shorter than the second routing line that has a length shorter than the third routing line,
wherein the third routing line has the number of routing contact holes smaller than the first and second routing lines in the resistance adjustment area,
wherein the plurality of routing lines disposed in the resistance adjustment area comprise upper conductive layers and lower conductive layers connected to each other through the routing contact holes, and
wherein the plurality of routing lines comprise single-line regions in which the upper conductive layers and the lower conductive layers do not overlap with each other between the routing contact holes.

11. The touch display device according to claim 10, wherein the zigzag patterns of the plurality of routing lines has different lengths in the resistance adjustment area.

12. The touch display device according to claim 10, wherein, in the resistance adjustment area, the plurality of routing lines have the straight line shape with the routing contact holes, and the plurality of display signal links have the straight line shape without a contact hole.

* * * * *